(12) United States Patent
Macerini

(10) Patent No.: US 10,523,012 B2
(45) Date of Patent: Dec. 31, 2019

(54) SAFETY DEVICE FOR PHOTOVOLTAIC INSTALLATIONS

(71) Applicant: ABB Schweiz AG, Baden (CH)

(72) Inventor: Sauro Macerini, Bucine (IT)

(73) Assignee: ABB Schweiz AG, Baden (CH)

(*) Notice: Subject to any disclaimer, the term of this patent is extended or adjusted under 35 U.S.C. 154(b) by 215 days.

(21) Appl. No.: 15/632,785

(22) Filed: Jun. 26, 2017

(65) Prior Publication Data

US 2017/0373201 A1 Dec. 28, 2017

(30) Foreign Application Priority Data

Jun. 24, 2016 (EP) ..................... 16176279

(51) Int. Cl.
*H02J 3/38* (2006.01)
*H02S 40/34* (2014.01)
(Continued)

(52) U.S. Cl.
CPC .............. *H02J 3/383* (2013.01); *H01H 9/54* (2013.01); *H01L 31/02021* (2013.01); *H02H 3/087* (2013.01); *H02H 3/202* (2013.01); *H02H 7/205* (2013.01); *H02S 40/34* (2014.12); *H02S 40/36* (2014.12); *H02S 50/10* (2014.12); *G08C 17/00* (2013.01); *G08C 2201/60* (2013.01); *Y02B 10/14* (2013.01); *Y02E 10/563* (2013.01)

(58) Field of Classification Search
CPC ... H01L 31/02021; H02S 40/34; H02S 40/36; H02S 50/10; H01H 9/54; H02H 3/087; H02H 3/202; H02H 7/205; H02J 3/383; G08C 17/00; G08C 2201/60; Y02B 10/14; Y02E 10/563
See application file for complete search history.

(56) References Cited

U.S. PATENT DOCUMENTS

2010/0326809 A1 12/2010 Lang et al.
2017/0373610 A1* 12/2017 White ..................... H02J 3/383

FOREIGN PATENT DOCUMENTS

DE 202006007613 U1 9/2006
DE 102005018173 A1 10/2006
(Continued)

OTHER PUBLICATIONS

European Search Report, EP16176279, ABB Schweiz AG, dated Dec. 14, 2016, 8 pages.

*Primary Examiner* — Carlos Amaya
(74) *Attorney, Agent, or Firm* — Taft Stettinius & Hollister LLP; J. Bruce Schelkopf

(57) ABSTRACT

The present disclosure is directed to a safety device for photovoltaic installations. The safety device includes a first terminal adapted to connect to a first output terminal of a solar panel, a second terminal adapted to connect to a second output terminal of the solar panel, a first switching module connected between the first terminal and the second terminal. The first switching module comprising a first switch and a first impedance connected in series. The first impedance includes one terminal connected to the first terminal and the first switch includes one terminal connected to the second terminal. A control module is adapted to read a control signal and drive the operation of the first switch based on the read value of the control signal. A power supply means is adapted to supply power to the control module.

22 Claims, 3 Drawing Sheets

(51) Int. Cl.
*H02S 50/10* (2014.01)
*H01H 9/54* (2006.01)
*H01L 31/02* (2006.01)
*H02H 3/087* (2006.01)
*H02H 3/20* (2006.01)
*H02H 7/20* (2006.01)
*H02S 40/36* (2014.01)
*G08C 17/00* (2006.01)

(56) References Cited

FOREIGN PATENT DOCUMENTS

| | | | |
|---|---|---|---|
| DE | 102010007495 | A1 | 8/2011 |
| DE | 102010023761 | A1 | 10/2011 |
| DE | 102012022919 | A1 | 5/2014 |
| EP | 2675035 | A2 | 12/2013 |

\* cited by examiner

SAFETY DEVICE FOR PHOTOVOLTAIC INSTALLATIONS

TECHNICAL FIELD OF THE INVENTION

The present invention refers to the technical field of photovoltaic installations and solar plants and in particular to the technical field of safety devices adapted to safely de-energize solar panels in case of emergency.

STATE OF THE ART

A photovoltaic installation is adapted to produce electrical energy through a direct conversion of the solar radiation into electricity. Typical photovoltaic installations comprise a plurality of solar modules combined, through series and/or parallel connections, to form a solar panel, adapted to supply the requested quantity of electrical power, voltage and current.

Solar panels are being mounted on top of the roofs of private homes and public buildings where they are radiated by the sun and provide additional sources of energy for private households and public facilities. Said solar panels are generally connected to power inverters adapted to convert the DC output electrical power of said solar panels to AC electrical power compatible with the grid requirements, for supplying private households, factories, public facilities and for sending excess power to the utility company, thus storing excess energy in the grid, in case of grid-tie inverters.

To optimize the operation of the photovoltaic generators, comprising solar panels and associated power inverters, and improve the overall efficiency thereof, the output voltage of the solar panels is chosen to be high: $600V_{DC}$ and $1000V_{DC}$ are the typical output DC voltages of most available solar panels today.

New technologies recently employed in the manufacturing of solar modules, will soon allow reaching higher output DC voltages and higher overall efficiency. Such high voltages can be dangerous for operators and therefore they are safety relevant.

In case of fire on the site where the photovoltaic generator is installed, for instance, the fire department has to ensure that the photovoltaic installation had been completely de-energized so as to prevent injuries and accidents due to electric shock or arcs when extinguishing agents are deployed and to guarantee the safety of the operators employed in controlling the fire.

Same situation happens in case of natural disasters or when maintenance is needed on the photovoltaic installation: the installation has to be completely de-energized before the operators are allowed to work on the solar panels or on the associated inverter to perform the necessary maintenance operation.

The solar panels cannot be easily disconnected from the photovoltaic installation they belong to, and therefore they pose a specific hazard to operators due to the high voltage at their output which can be lethal.

For the above reason, solar panels are usually provided with safety devices adapted to effectively de-energize the photovoltaic installation in a short time, through disconnecting said solar panels from downstream inverters and/or reducing the solar panel output voltage at no load to a safe level.

Typical implementations of said safety devices in the state of the art comprise a number of electromechanical devices (contactors or relays) and adapted to disconnect the solar panel from the inverter by breaking a series connection.

Furthermore, said safety devices may include additional contacts to connect a bleeder resistor adapted to discharge the inverter input capacitance that may still be charged after the safety device contactors have been switched open, and the solar panels disconnected from the inverter. Said bleeder resistor is usually chosen of high ohmic value and is connected across the inverter input lines only after said safety device contactors have been switched open.

German patent application DE102005018173A1 discloses a safety device for photovoltaic installations, adapted to be operated either manually or automatically, provided with a bypass to short-circuit the photovoltaic installation. High short-circuit currents can flow through the bypass, therefore, the safety device has to be dimensioned to withstand those currents. Furthermore, the safety device disclosed in patent application DE102005018173A1 works with currents greater than 10 A and therefore proper heat dissipation means are needed that makes the structure of the device more complex and costly.

German utility model DE202006007613U1 discloses a fire-protection device for photovoltaic installations, adapted to interrupt, in case of emergency, each supply line to the inverter. After disconnection is made, hazardous voltages can still be present between the solar panel terminal.

U.S. patent application number US20100326809A1 discloses a safety switchgear for a solar installation characterized by a bypass that is situated between the two connections of the solar panel and upstream from the feed lines and that has at least one switching mechanism to close the contact points, whereby at least one additional switching mechanism for purposes of opening the contact points is arranged in each of the two feed lines. In the embodiments described in US20100326809A1, the discharge current of the input capacitance of the inverter can reduce the life and harm the operation of the contacts of the switching mechanism.

To overcome the drawbacks of the state of the art systems, the present invention discloses an improved safety device for photovoltaic installations adapted to reduce the voltage across the DC conductors of a solar panel and between said DC conductors and ground, below a safe level within a predetermined time.

The reduction of the voltage across the DC conductors of a solar panel according to the present invention is achieved by means of the insertion of a suitable load impedance across the DC conductors. Said load impedance has to be sufficiently low to force the voltage to drop below the safe level within a predetermined time, and sufficiently high in order to limit the insertion current on the connection devices, thus preventing electrical damages to said connection devices.

The connection of said impedance between the DC conductors of the solar panel can be implemented by either one or a plurality of switches each having a different impedance connected in series, thus allowing minimal power losses and optimization of the switch size. Furthermore, according to an embodiment of the present invention, said impedance may change as function of time and/or temperature during a predetermined time interval. According to another embodiment of the present invention, the switching device adapted to connect the impedance to the solar panel can be implemented either by an electro-mechanical switch or by a solid-state switch. According to a further embodiment of the present invention, the auxiliary power supply to the internal circuitries of the device according to the present invention is energized by the very DC voltage that the device according to the present invention is adapted to reduce below a safe level in case of emergency.

Further features and advantages of the present invention will be apparent in the following description of a non-limitative embodiment with reference to the figures in the accompanying drawings, which are diagrammatic and show functional blocks which are adapted to be implemented with a hardware structure according to different circuitry solutions in practice. In detail:

DETAILED DESCRIPTION OF THE INVENTION

The device according to the present invention is adapted to securely switch off a photovoltaic installation by placing a low-impedance by-pass across the output terminals of the solar panel of said photovoltaic installation. In one embodiment, the device according to the present invention is further adapted to discharge the capacitance between each output terminal of said solar panel and ground.

Figure 1:
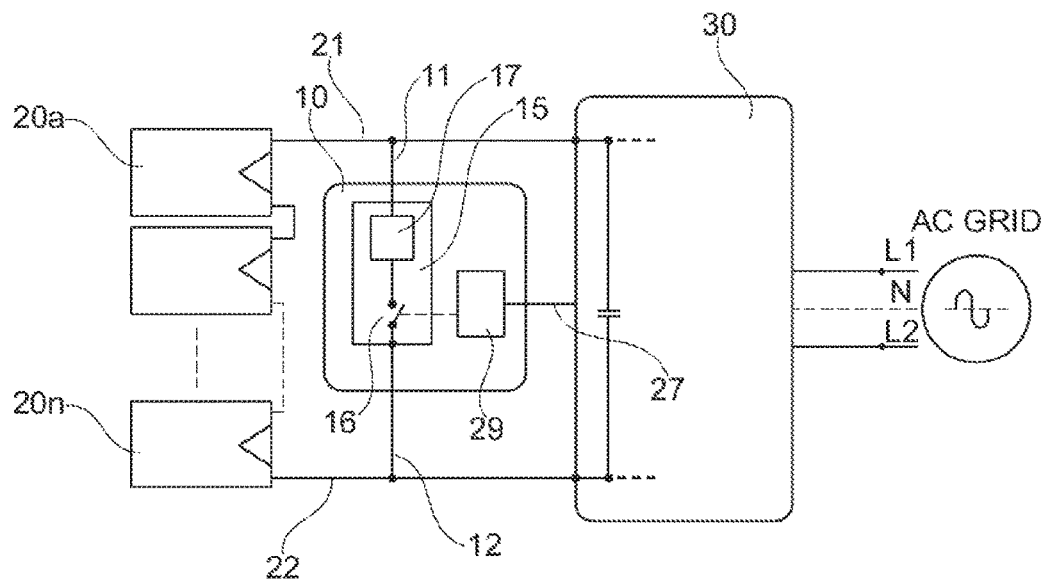
FIG. 1 shows a first schematic of a first preferred embodiment of the present invention.
Figure 2:
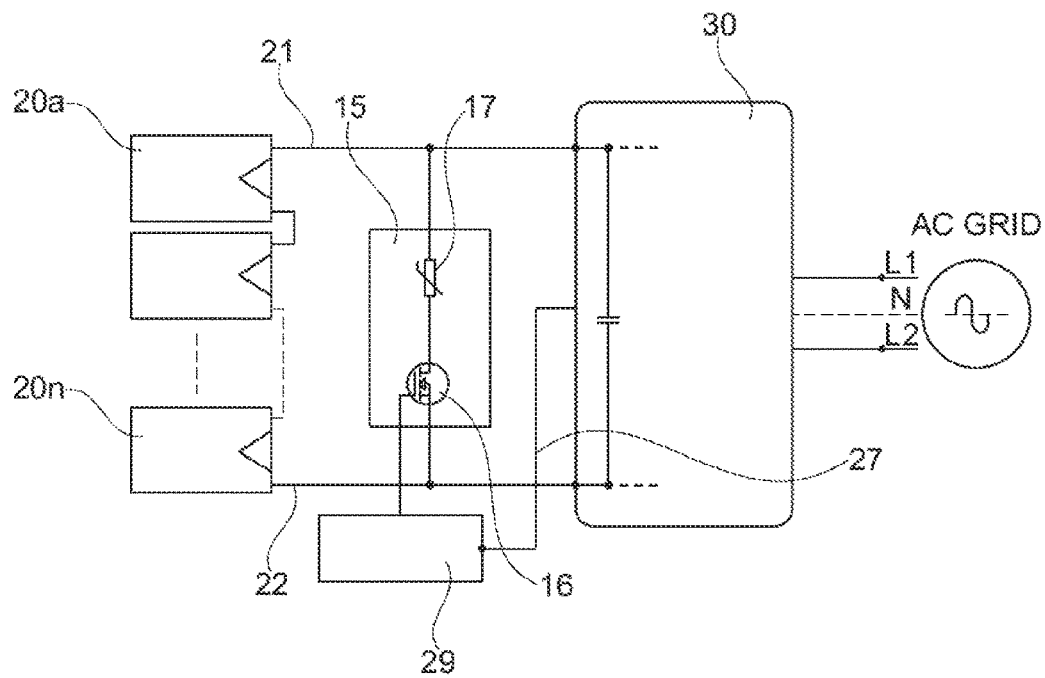
FIG. 2 shows a second schematic of a first preferred embodiment of the present invention.

With reference to the enclosed FIGS. 1 and 2, the device 10 according to the present invention is adapted to connect between the output of a solar panel 20 and the input of a downstream inverter 30, said solar panel comprising one or more solar modules 20a-20n.

In detail, the device according to the present invention 10, in its simplest embodiment, comprises:
- a first terminal 11 adapted to connect to a first output terminal 21 of a solar panel 20;
- a second terminal 12 adapted to connect to a second output terminal 22 of said solar panel 20 and
- a first switching module 15 connected between said first 11 terminal and said second 12 terminal, said first switching module 15 comprising at least a first controllable switch 16 and at least a first impedance 17 connected in series;
- a control module 29 adapted to read a control signal 27 and drive the operation of said first controllable switch 16 accordingly;
- power supply means adapted to supply power to said control module 29.

As a non limitative example, said controllable switch can be an electro-mechanical switch, like a relay switch, or a semiconductor switch like a Mosfet or an IGBT.

Said control module 29 is adapted to receive at least a control signal 27 and comprise suitable means to drive said controllable switch 16 in accord to the command received through said control signal 27. In a preferred embodiment of the present invention, said control module 29 may be suitably associated to the controller of said inverter 30 and the setting of the controller of the inverter 30 can be such as to operate the device according to the present invention after the inverter has been turned off—due to emergency or in course of normal operation—in order to make the photovoltaic installation safe for inspection and maintenance. In other embodiments said control module 29 can be operated directly through the user interface of the inverter 30 and, in general, may be adapted to receive control signals 27 from an external control device, automatic or user-operated, and from remote, through a wireless radio communication or through a wired communication, for instance a power-line communication, or a combination of both.

Furthermore, an external emergency stop button, adapted to be operated manually by a user in case of emergency, can be provided. As an example, if said control signal 27 is a $+24V_{DC}$ line coming from the controller of said inverter 30 and the emergency is detected when said control signal drops to $0V_{DC}$, then an external emergency stop button can be added, adapted to be manually operated by a user in case of emergency to interrupt the control signal 27 line coming from the inverter 30 or to short-circuit said control signal 27 by means of a parallel connection.

The operating mode of the device according to the present invention 10 is the following: when said control module 29 detects, through sensing said control signal 27, an emergency situation, and therefore the photovoltaic installation has to be completely de-energized, said control module 29 drives said first switching module 15 in order to close said first switch 16 and short circuit the output terminals of the solar panel 20. The short circuit between the output terminals of the solar panel 20 will be kept until the emergency situation is over.

In a preferred embodiment, said power supply means adapted to supply power to the control module 29 of the safety device according to the present invention comprise a power supply, in turn adapted to take its power source directly from the solar panel output voltage itself, the DC voltage that the device according to the present invention is adapted to reduce below a safe level in case of emergency.

In this preferred embodiment, the device according to the present invention 10 is adapted to periodically release the short circuit at the output terminals of the solar panel 20. By doing so, the voltage at the output terminals of the solar panel 20 is allowed to rise up again in order to keep said power supply on and therefore keep the control module 29 working.

To accomplish the above feature, said power supply of said control module 29 can be designed, according to techniques well known in the art, with input voltage hysteresis, choosing the turn-on threshold greater than the turn-off threshold and choosing both thresholds lower than the required voltage safe level to be guaranteed, in case of emergency, at the output of the solar panel.

Alternatively said power supply of said control module 29 can be adapted to periodically turn off and on according to a predetermined temporization.

Said control module 29 may be provided with galvanic isolation between the input voltage side and the control signal 27 side, that is between the solar panel side and the inverter side, to be compatible for connection to the control module of the inverter. In this case, the self-power supply feature of the inverter side of said control module 29 can be implemented by taking its power source directly from said control signal 27, similarly to the way the power source of the solar panel side of said control module 29 is taken directly from said solar panel output voltage. The self-power supply feature of the inverter side of said control module 29 will be advantageously provided with input voltage hysteresis to minimize the hick-up frequency between turn on and turn off.

According to the present invention, said first impedance 17 should be characterised by a value sufficiently low to cause the solar panel output voltage to drop below a predetermined level within a predetermined time, and, at the same time, sufficiently high to limit the inrush current on the switch 16 of the device. Limiting said inrush current prevents damages to said switch 16, prolongs its life time and allows for the employment of a switch with a lower current rating.

Therefore, the main design constraints of said first impedance 17 are the safe voltage at the output of the solar panel in emergency conditions, the time needed for the voltage at the output of the solar panel to reach the safe value, after the emergency conditions starts, and the maximum inrush current allowable on the switch 16 of the device.

As a non limiting example, considering the maximum allowable solar panel voltage $V_{LIM}$ and the short-circuit current of the solar panel $I_{MAX}$, then said first impedance 17 should be lesser or equal than $V_{LIM}/I_{MAX}$. On the other hand, being $V_{MAX}$ the open-circuit output voltage of the solar panel and $I_{SW\_MAX}$ the maximum peak current allowable of said first switch 16, then said first impedance 17 should be larger or equal than $V_{MAX}/I_{SW\_MAX}$. If the solar panel is rated for 300V (nominal output voltage) and 10 A (short circuit current) and its safe output voltage is requested to be 30V, and said first switch is implemented by a power MOSFET characterized by a peak maximum current of 200 A, then said first impedance should be lesser or equal than 30V/10 A=3 Ohm and larger or equal than 300V/200 A=1.5 Ohm.

Advantageously, said first 17 impedance may be variable with time and/or temperature and may comprise at least one PCT (Positive Temperature Coefficient resistor) and/or at least one NTC (Negative Temperature Coefficient resistor).

Furthermore, said first 17 impedance may be resistive or may comprise reactive components, depending on the voltage and the current said impedances are supposed to handle.

As an example, a reactive impedance is preferred when the output voltage of said solar panel 20 is low and related output current is high. A resistive impedance is preferred when the output voltage of said solar panel 20 is high and related output current is low.

In a preferred embodiment, said first 17 impedance may comprise one or more stages and suitable by-pass means adapted to insert or short-circuit said stages. Said stages may be advantageously inserted or short-circuited independently from each other and/or in sequence. This allows changing said impedances values according to the installation characteristics and needs.

Figure 3:
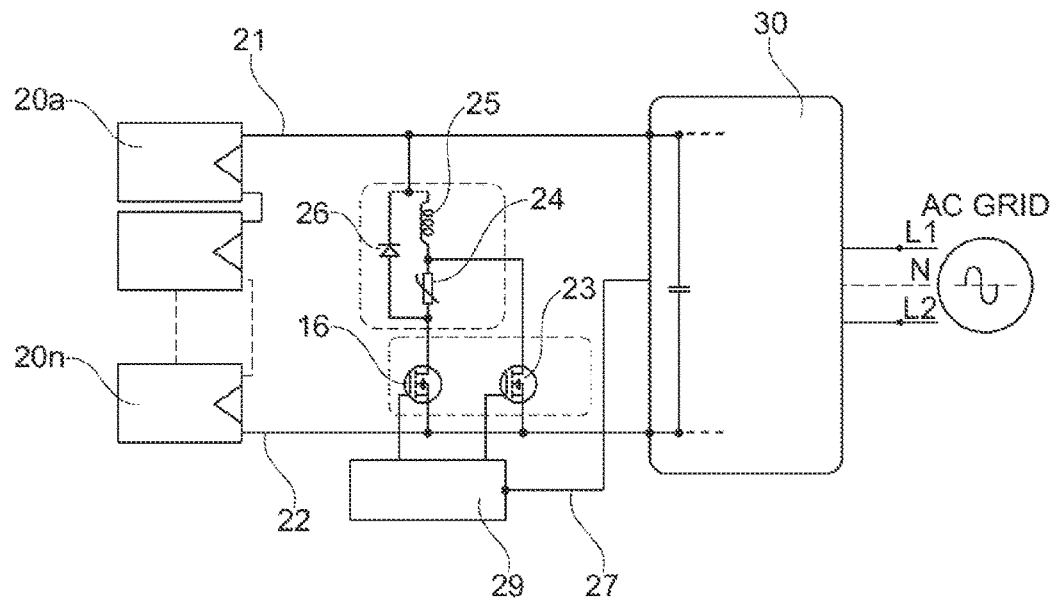
FIG. 3 shows a second preferred embodiment of the present invention wherein the switching module comprises a pair of switches.

Enclosed FIG. 3 illustrates a preferred embodiment of the present invention wherein said first switching module 15 comprises a first switch 16 and a further switch 23. The first switch 16 is connected in series to a first impedance 17 comprising a fixed or variable resistor 24 (such as a PTC or a NTC), in turn serially connected to an inductor 25. Furthermore, a snubber diode 26 is preferably connected in parallel to said first impedance 17 in order to limit the voltage spike across first switch 16 at turn-off.

Said further switch 23 is connected between said first output terminal 21 (or said second output terminal 22) of said solar panel 20, and the mid-point between said variable resistor 24 and said inductor 25 and is adapted to by-pass said variable resistor 24 when needed, in order to minimize the power dissipation and the overheating of the circuit that can be detrimental of the device's life.

The operation of the embodiment depicted in enclosed FIG. 3 is as follows: said first switch 16 is the first to turn on and, in cooperation with the resistor 24, causes the output voltage of the solar panel 20 to drop below the requested safe level. Then, to stop the power dissipation on resistor 24, said further switch 23 turns on in order to by-pass said resistor 24. The inductor 25, series-connected to said further switch 23, is adapted to limit the inrush switching current of switch 23. Said inductor 25 is preferably characterized by a low resistance, in order to keep the ohmic power dissipation at a very low level.

Figure 4:
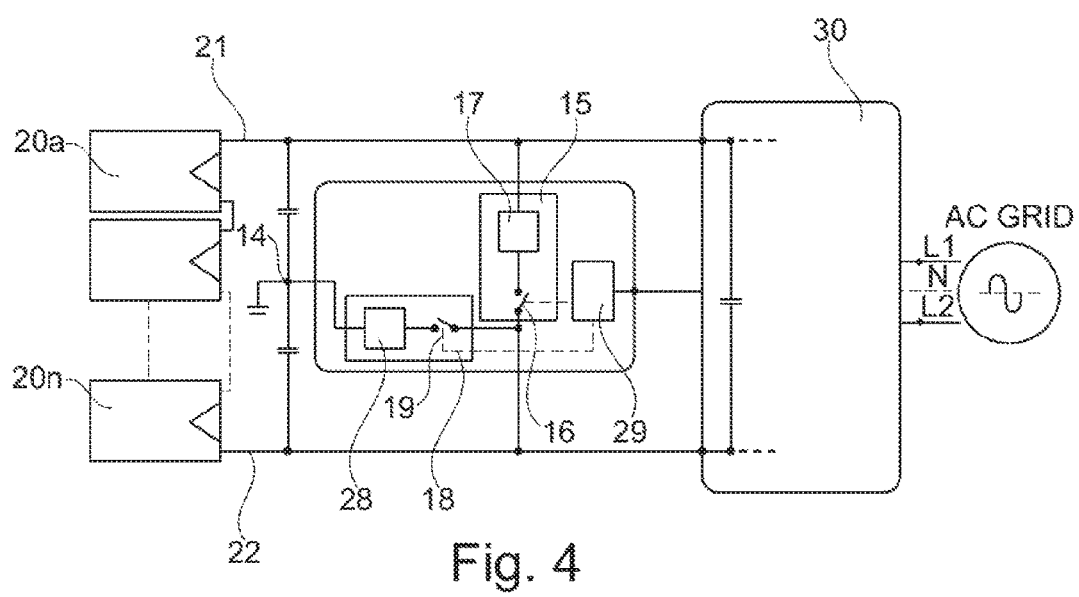
FIG. 4 shows a first schematic of a third preferred embodiment of the present invention.
Figure 5:
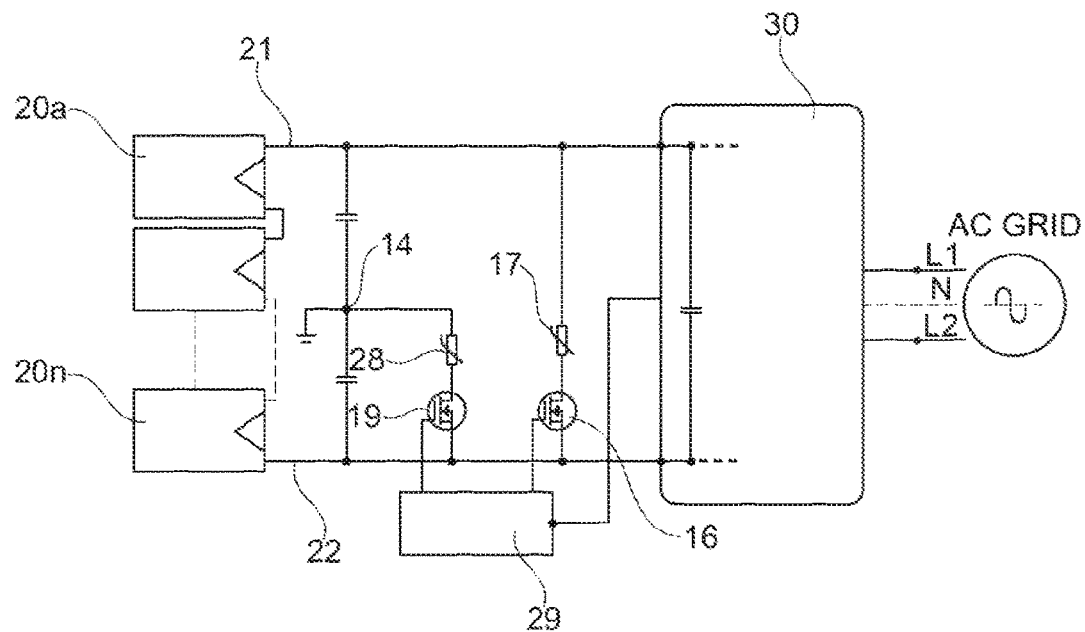
FIG. 5 shows a second schematic of a third preferred embodiment of the present invention.
Figure 6:
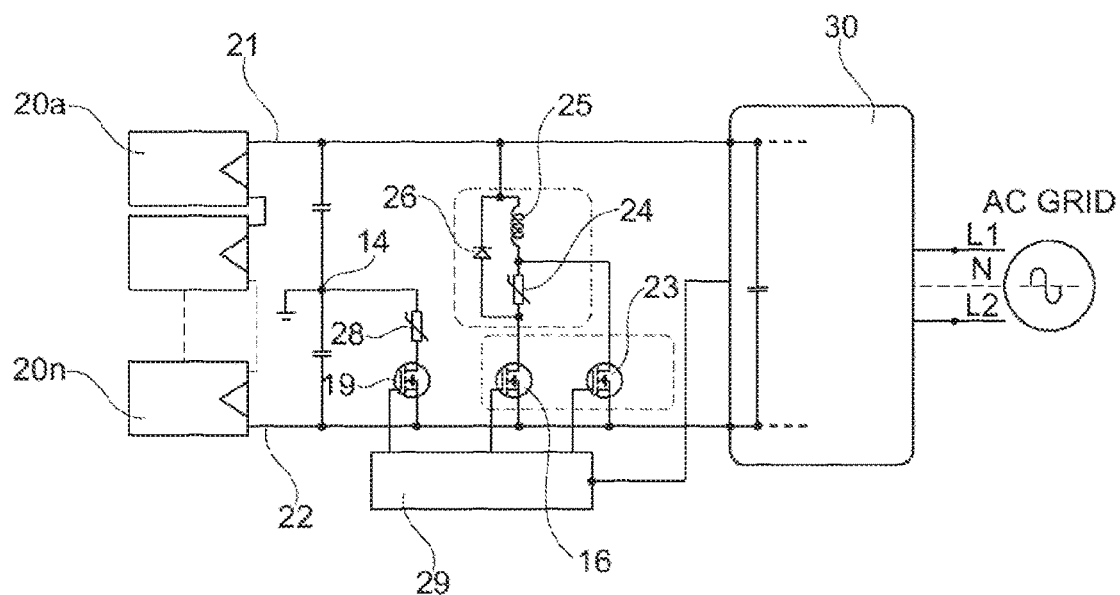
FIG. 6 shows a fourth preferred embodiment of the present invention wherein one of the switching modules comprises a pair of switches.

With reference to enclosed FIGS. 4, 5 and 6, another embodiment of the device 10 according to the present invention further comprises:
 a third terminal 13 adapted to connect to the ground terminal 14;
 a second switching module 18 connected between a first output terminal 21 of said solar panel 20 and ground, said second switching module 18 comprising a second switch 19 and a second impedance 28 connected in series;

Said second switching module 18 is adapted to discharge the parasitic capacitances between the solar panel 20 terminals and ground that might still be charged after the solar panel 20 terminals have been short-circuited. The value of said second impedance 28 is preferably chosen to be adapted to discharge said parasitic capacitance in a time much smaller than the maximum allowable discharge time which is normally 10 seconds.

The device according to the present invention can be produced as a stand-alone device, or integrated into the solar panel or into the inverter.

In case of a stand-alone device, a proper installation position is in the vicinity of the hazardous voltage to be controlled. It is preferable not to have long connection cables that may result in parasitic inductances that may harm the correct operation of the device itself.

Furthermore, in order to be able to retrofit existing photovoltaic installations, the device according to the present invention can be advantageously provided with a quick-plug standard connector for photovoltaic applications and with electrical connection suitable for connecting the solar panels upstream to the photovoltaic inverter downstream.

The housing of the device according to the present invention may be provided with an external enabling ON/STAND-BY switch and associated visual indicator (e.g. made of at least a simple LED) of the device status.

The invention claimed is:
1. A safety device for photovoltaic installations comprising:
 a first terminal adapted to connect to a first output terminal of a solar panel;
 a second terminal adapted to connect to a second output terminal of said solar panel;
 a first switching module connected between said first and said second terminal, said first switching module comprising at least a first switch and at least a first impedance connected in series, said first impedance having one terminal connected to said first terminal and said first switch having one terminal connected to said second terminal;
 a control module adapted to read a control signal and drive the operation of said first switch based on the read value of said control signal;
 power supply means adapted to supply power to said control module;

wherein in an emergency situation the control module closes the first switch of the first switching module to thereby short circuit the first and second output terminals of the solar panel.

2. The safety device for photovoltaic installations according to claim 1, wherein said first impedance has a value adapted to keep the solar panel output voltage below a predetermined safe level and limit the inrush current on said first switch.

3. The safety device for photovoltaic installations according to claim 1, wherein said first impedance comprises one or more stages and suitable by-pass means adapted to insert or short-circuit said stages.

4. The safety device for photovoltaic installations according to claim 1, wherein said first impedance comprises a resistor serially connected to an inductor, in that said first switching module comprises a further switch having one terminal connected to said second terminal and the other terminal connected to the mid-point between said resistor and said inductor, and in that said control module is further adapted to drive said further switch to by-pass said resistor to limit power dissipation when needed.

5. The safety device for photovoltaic installations according to claim 4 further comprising a diode connected n parallel to said first impedance and adapted to limit the voltage spike across said first switch at turn-off.

6. The safety device for photovoltaic installations according to claim 4, wherein said resistor is a variable resistor.

7. The safety device for photovoltaic installations according to claim 1, further comprising:
a third terminal adapted to connect to a ground terminal; and
a second switching module connected between one of the first and second output terminals of said solar panel and the ground terminal, said second switching module comprising a second switch and a second impedance connected in series.

8. The safety device for photovoltaic installations according to claim 7 wherein said second impedance comprises a variable resistor.

9. The safety device for photovoltaic installations according to claim 7, wherein said first switch and said second switch are of electro-mechanical or semiconductor type.

10. The safety device for photovoltaic installations according to claim 1, wherein said power supply means comprise a power supply wherein the input voltage is the solar panel output voltage.

11. The safety device for photovoltaic installations according to claim 1 wherein said control module is provided with galvanic isolation between an input voltage side and a control signal side between the solar panel and an inverter.

12. The safety device for photovoltaic installations according to claim 11 wherein said power supply means comprise a further power supply wherein the input voltage is provided by said control signal.

13. The safety device for photovoltaic installations according to claim 10, wherein said power supply is provided with input voltage hysteresis to minimize the hick-up frequency between turn on and turn off.

14. The safety device for photovoltaic installations according to claim 10 wherein said power supply is adapted to periodically turn off and on according to a predetermined temporization.

15. The safety device for photovoltaic installations according to claim 1 comprising an emergency switch, operable by a user through an external emergency button and adapted to force said control signal active.

16. The safety device for photovoltaic installations according to claim 1 wherein said safety device is integrated into said solar panel or into an inverter connected to said solar panel.

17. The safety device for photovoltaic installations according to claim 1 comprising a housing provided with an external enabling ON/STAND-BY switch and associated visual indicator.

18. The safety device for photovoltaic installations according to claim 1 comprising quick-plug standard connectors for photovoltaic applications adapted to connect to a solar panel and to a photovoltaic inverter.

19. The safety device for photovoltaic installations according to claim 4 wherein said further switch is of electro-mechanical or semiconductor type.

20. The safety device for photovoltaic installations according to claim 2, wherein said first impedance comprises one or more stages and suitable by-bass means adapted to insert or short-circuit said stages.

21. The safety device for photovoltaic installations according to claim 1, wherein said first impedance is variable with time or with temperature.

22. The safety device for photovoltaic installations according to claim 1, wherein said first impedance comprises a PCT (Positive Temperature Coefficient resistor) or a NTC (Negative Temperature Coefficient resistor).

* * * * *